United States Patent
Tanner et al.

(10) Patent No.: US 10,944,413 B2
(45) Date of Patent: Mar. 9, 2021

(54) FIELD DEVICE IN MEASUREMENT AND AUTOMATION TECHNOLOGY COMPRISING A GALVANIC ISOLATION DEVICE

(71) Applicant: Endress+Hauser Flowtec AG, Reinach (CH)

(72) Inventors: Lukas Tanner, Oberwil BL (CH); Daniel Kollmer, Maulburg (DE); Werner Tanner, Gelterkinden (CH); Marita Paetzold, Efringen-Kirchen (DE); Lüder Bosse, Birsfelden (CH)

(73) Assignee: Endress+Hauser Flowtec AG, Reinach (CH)

( * ) Notice: Subject to any disclaimer, the term of this patent is extended or adjusted under 35 U.S.C. 154(b) by 0 days.

(21) Appl. No.: 16/644,087

(22) PCT Filed: Aug. 16, 2018

(86) PCT No.: PCT/EP2018/072215
§ 371 (c)(1),
(2) Date: Mar. 3, 2020

(87) PCT Pub. No.: WO2019/042780
PCT Pub. Date: Mar. 7, 2019

(65) Prior Publication Data
US 2020/0244278 A1    Jul. 30, 2020

(30) Foreign Application Priority Data
Sep. 4, 2017 (DE) .................. 10 2017 120 266.8

(51) Int. Cl.
*H03M 1/08* (2006.01)
*H05B 45/37* (2020.01)
*H01L 23/48* (2006.01)

(52) U.S. Cl.
CPC .......... *H03M 1/0827* (2013.01); *H01L 23/48* (2013.01); *H05B 45/37* (2020.01)

(58) Field of Classification Search
CPC ...... H03M 1/0827; H05B 45/37; H01L 23/48; H05K 7/1469; H01P 1/04; H01R 24/40
See application file for complete search history.

(56) References Cited

U.S. PATENT DOCUMENTS 8,830,108 B2 * 9/2014 Balle .................. H03M 1/0827
                                                            341/157
9,882,572 B2 * 1/2018 Yoshida ................. G01D 21/00

FOREIGN PATENT DOCUMENTS

CN       105047634 A     11/2015
DE    202006006359 U1     7/2006
(Continued)

OTHER PUBLICATIONS

Zhang, Q., Khan, S.N., Compact Broadside Coupled Directional Coupler Based on Coplanar CRLH Waveguides, Journal of Electromagnetic Waves and Applications, vol. 23, (http://doi.org/10.1163/156939309787604418), Taylor & Francis Group, 2009, Published online: Apr. 3, 2012, 12 pp. (267-277), 2009.

(Continued)

*Primary Examiner* — Khai M Nguyen
(74) *Attorney, Agent, or Firm* — Kelly J. Smith; Endress+Hauser (USA) Holding Inc.

(57) ABSTRACT

Disclosed is a field device of automation technology, comprising: a housing having a wall; a data transmission means arranged on an outside of the housing wall; and an electronic operating circuit arranged in a housing chamber and is adapted to operate the data transmission means, wherein the data transmission means and the electronic operating circuit are connected via an electrical signal line having a plurality of electrical conductors, wherein a first electrical conductor is adapted to lead a data signal and wherein at least a second (Continued)

electrical conductor is adapted to shield the first electrical conductor, wherein the signal line has an isolation device adapted to isolate a first signal line section galvanically from a second signal line section, wherein the isolation device includes an electromagnetically transparent plate having a first lateral surface and a second lateral surface parallel to the first lateral surface.

15 Claims, 3 Drawing Sheets

(56) References Cited

FOREIGN PATENT DOCUMENTS

| | | |
|---|---|---|
| DE | 102011003306 B3 | 4/2012 |
| DE | 102015222400 A1 | 6/2017 |
| EP | 3029782 A1 | 6/2016 |
| WO | 2016174467 A1 | 11/2016 |
| WO | WO2016174467 A1 | 11/2016 |

OTHER PUBLICATIONS

Journal of Electromagnetic Waves and Applications, vol. 23 (2-3) Dec. 31, 2009, Q. Zhang, S. N. Khan, "Compact Broadside Coupled Directional Coupler Based on Coplanar CRLH Waveguides".

* cited by examiner

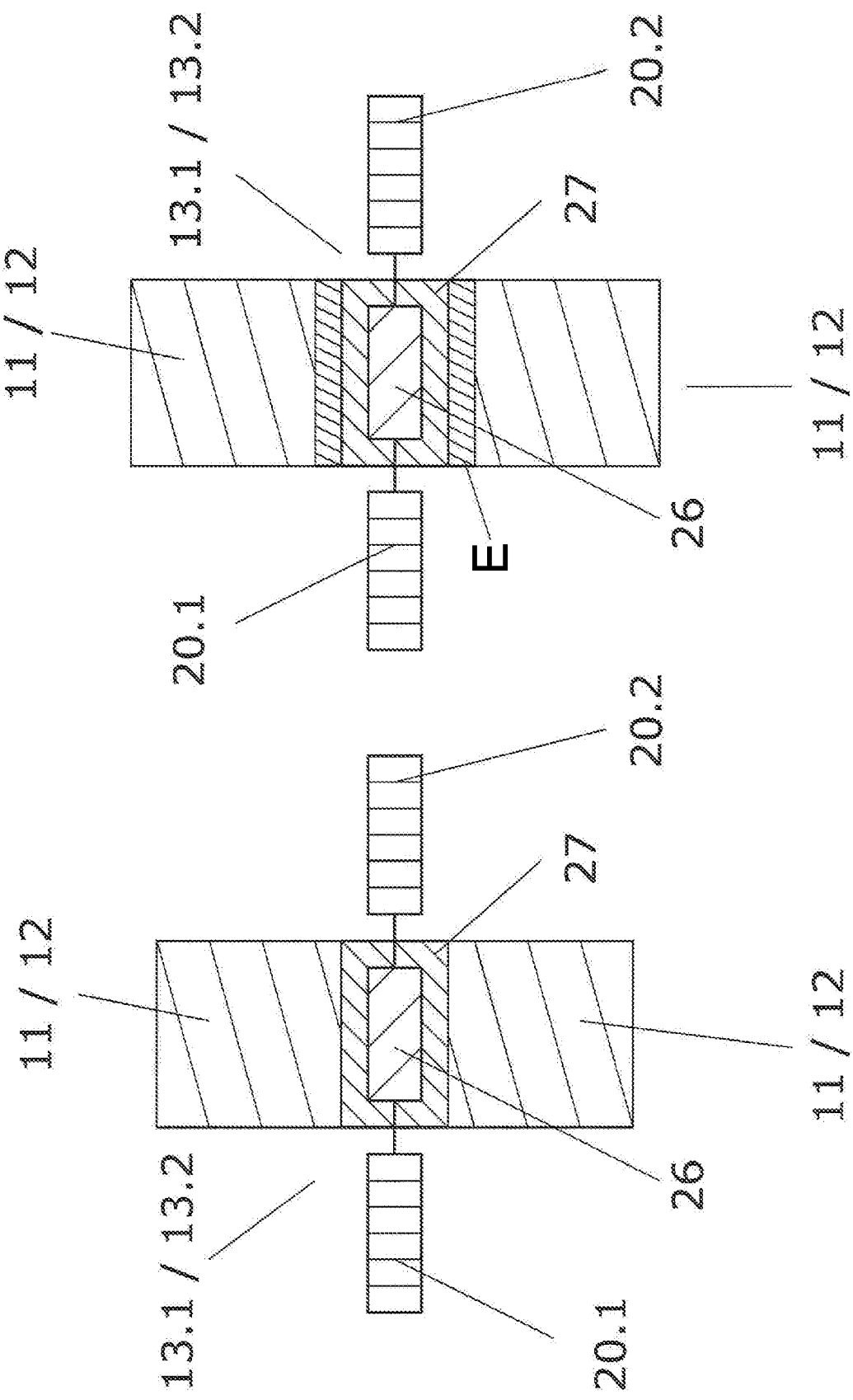

FIELD DEVICE IN MEASUREMENT AND AUTOMATION TECHNOLOGY COMPRISING A GALVANIC ISOLATION DEVICE

CROSS-REFERENCE TO RELATED APPLICATIONS

The present application is related to and claims the priority benefit of German Patent Application No. 10 2017 120 266.8, filed on Sep. 4, 2017, and International Patent Application No. PCT/EP2018/072215, filed on Aug. 16, 2018, the entire contents of which are incorporated herein by reference.

TECHNICAL FIELD

The invention relates to a field device for application in measurement- and automation technology. The field device comprises an electronic operating circuit as well as a data transmission means. These are connected by means of a signal line, wherein the signal line has an isolation device for galvanic isolation. An isolation device of such a signal line is necessary in environments containing explosive gases, in order to fulfill provisions of applicable Ex-i-, or Ex-d standards.

BACKGROUND

The state of the art, as represented, for example, by the publication, EP3029782A1, proposes to bring together conductors of an inlet side coaxial line and an outlet-side coaxial line on a printed circuit board in the form of a high frequency capable, conductor structure, wherein an isolating element is arranged on one side of the printed circuit board for galvanic signal isolation of the input- and output sides.

The providing of an additional isolation element on a printed circuit board complicates the manufacture and can have disadvantages as regards the transmission characteristics of alternating voltage signals.

SUMMARY

An object of the invention is, consequently, a field device having a signal line, in the case of which requirements of a safety standard are met in simple and robust manner.

A field device of the invention for application in measurement- and automation technology comprises:

A housing having a housing wall and at least one housing chamber, wherein the at least one housing chamber is bounded at least partially by the housing wall;

a measurement electronics adapted to produce at least one measurement signal representing a measured variable;

a data transmission means; and an electronic operating circuit, which is arranged in a first housing chamber and is adapted to operate the data transmission means and the measurement electronics as well as to convert the measurement signal into at least one measured value;

wherein the data transmission means is arranged outside of the first housing chamber and is adapted to exchange data with the electronic operating circuit of the field device;

wherein the data transmission means and the electronic operating circuit are connected via an electrical signal line, wherein the signal line has a plurality of electrical conductors, which are adapted to transfer a data signal between the data transmission means and the electronic operating circuit, wherein a first electrical conductor is adapted to lead a first electrical current transporting the data signal and wherein at least a second electrical conductor is adapted to lead a second electrical current transporting the data signal, wherein the second electrical current is opposite to the first electrical current, wherein the signal line has an isolation device, which is adapted to isolate at least partially a first, data transmission means side, signal line section galvanically from a second, operating electronics side, signal line section, wherein each electrical conductor has a first, data transmission means side, conductor section and a second, galvanically isolated, operating electronics side, conductor section, wherein the conductor sections are arranged on the isolation device, wherein, in the case of at least one electrical conductor, the first conductor section and the second conductor section are galvanically isolated, characterized in that the isolation device includes an electromagnetically transparent plate having a first lateral surface and a second lateral surface parallel to the first lateral surface, wherein in the region of the isolation device the conductor sections of the first signal line section are arranged on the first lateral surface and wherein the conductor sections of the second signal line section are arranged on the second lateral surface, wherein each first conductor section is opposite the corresponding second conductor section along a lateral surface normal, and wherein the plate has at least a minimum thickness or dielectric strength required by a safety standard.

In the case of an electrical conductor without isolation, the first signal line section can be galvanically connected with the second signal line section, for example, by means of a via arranged in the electromagnetically transparent plate. A galvanic isolation is provided either in the case of the first conductor or in the case of the at least one, second conductor or in the case of all conductors and serves for blocking, between data transmission means and electronic operating circuit, direct currents or low frequency currents with usual frequencies of grid voltages.

The signal line is, in such case, adapted to enable a high data transmission rate between the data transmission means and the electronic operating circuit. Especially, the signal line should be adapted to be able to transmit data according to established wireless network protocol families such as, for example, IEEE 802.11 or IEEE 802.15. In this way, for example, the transfer of contents such as Web pages or larger files is possible.

The electromagnetically transparent plate can be, for example, a printed circuit board.

In an embodiment, the safety standard is a standard from the following list:

Product safety standard IEC 60664-1 of the year 2007 or Ex-d standard IEC 60079-1 of the year 2014, or Ex-i standard IEC 60079-11 of the year 2011 or IEC 61010-1 of the year 2010.

In an embodiment, the housing includes a second housing chamber, which is separated from the first housing chamber by an inner wall of the housing, wherein the inner wall has a second signal feedthrough, through which the signal line extends.

In an embodiment, each electrical conductor includes a first, data transmission means side, conductor section and a second, galvanically isolated, operating electronics side, conductor section.

In an embodiment, the data transmission means includes an antenna apparatus adapted to receive and/or to transmit high frequency signals, wherein the antenna apparatus is arranged on an outside of the housing wall, wherein the signal line extends through a first signal feedthrough in the housing wall.

In an embodiment, the first electrical conductor and the second electrical conductor extend on the lateral surfaces in parallel with one another, and/or wherein the conductor sections of the first signal line section on the first lateral surface extend in parallel with the conductor sections of the second signal line section on the second lateral surface.

In an embodiment, the housing and the first signal feedthrough, and the second signal feedthrough, are embodied pressure-resistanty according to an Ex-d standard, especially IEC 60079-1, wherein the isolation device is arranged in the first signal feedthrough, and/or the second signal feedthrough and is cast pressure-resistantly.

An explosion occurring in a housing chamber can, thus, be kept in the housing chamber or at least in the housing.

In an embodiment, two second electrical conductors are associated with the first electrical conductor, and the second electrical conductors are arranged on opposite sides of the first electrical conductor. In this way, radiation of a signal is better suppressed, whereby the signal/noise ratio is significantly improved.

In an embodiment, the plate is composed of a dielectric material, wherein the material comprises especially at least one material from the following groups of materials:

ceramics, plastics, glass.

In an embodiment, the electrical conductors in the region of the isolation device are prepared by means of a printing- or etching method on the lateral surfaces of the plate.

In an embodiment, the electrical conductors on the lateral surfaces are metallic and comprise especially at least one of the following materials:

copper, silver, aluminum, iron, or an alloy containing at least one of these elements.

In an embodiment, a length of the conductor sections in the region of the isolation device in an overlap region is at least 5 mm and especially at least 10 mm and preferably at least 20 mm and/or at most 150 mm and especially at most 120 mm and preferably at most 100 mm.

Especially, the length of the conductor sections is adapted to a frequency of the data signal.

In an embodiment, the data signal has a frequency of at least 0.25 GHz, and especially at least 0.4 GHz, and preferably at least 1 GHz, and/or a frequency of at most 10 GHz, and especially at most 8 GHz, and preferably at most 6 GHz.

In an embodiment, a wavelength of the data signal is greater by a factor F than the length of the conductor sections in the region of the galvanic isolation device, wherein F is greater than 1 and especially greater than 2 and preferably greater than 3.5 and/or wherein F is less than 5.5 and especially less than 5.0 and preferably less than 4.5.

In an embodiment, the field device includes an enclosure of the isolation device, in which enclosure the isolation device is arranged, wherein the enclosure is arranged in the first signal feedthrough, or in the second signal feedthrough, wherein an outside of the enclosure is connected securely with the first signal feedthrough, or with the second signal feedthrough, wherein the isolation device is cast pressure-resistantly in the enclosure, especially by means of a potting material.

In an embodiment, the field device is a fill level- or flow meter.

BRIEF DESCRIPTION OF THE DRAWINGS

In the following, the field device will now be described based on examples of embodiments presented in the appended drawing, the figures of which show as follows:

FIGS. 3 *a*), 3 *b*) show two examples of an installation of an isolation device of the present disclosure in a signal feedthrough of the field device.

DETAILED DESCRIPTION

Figure 1:
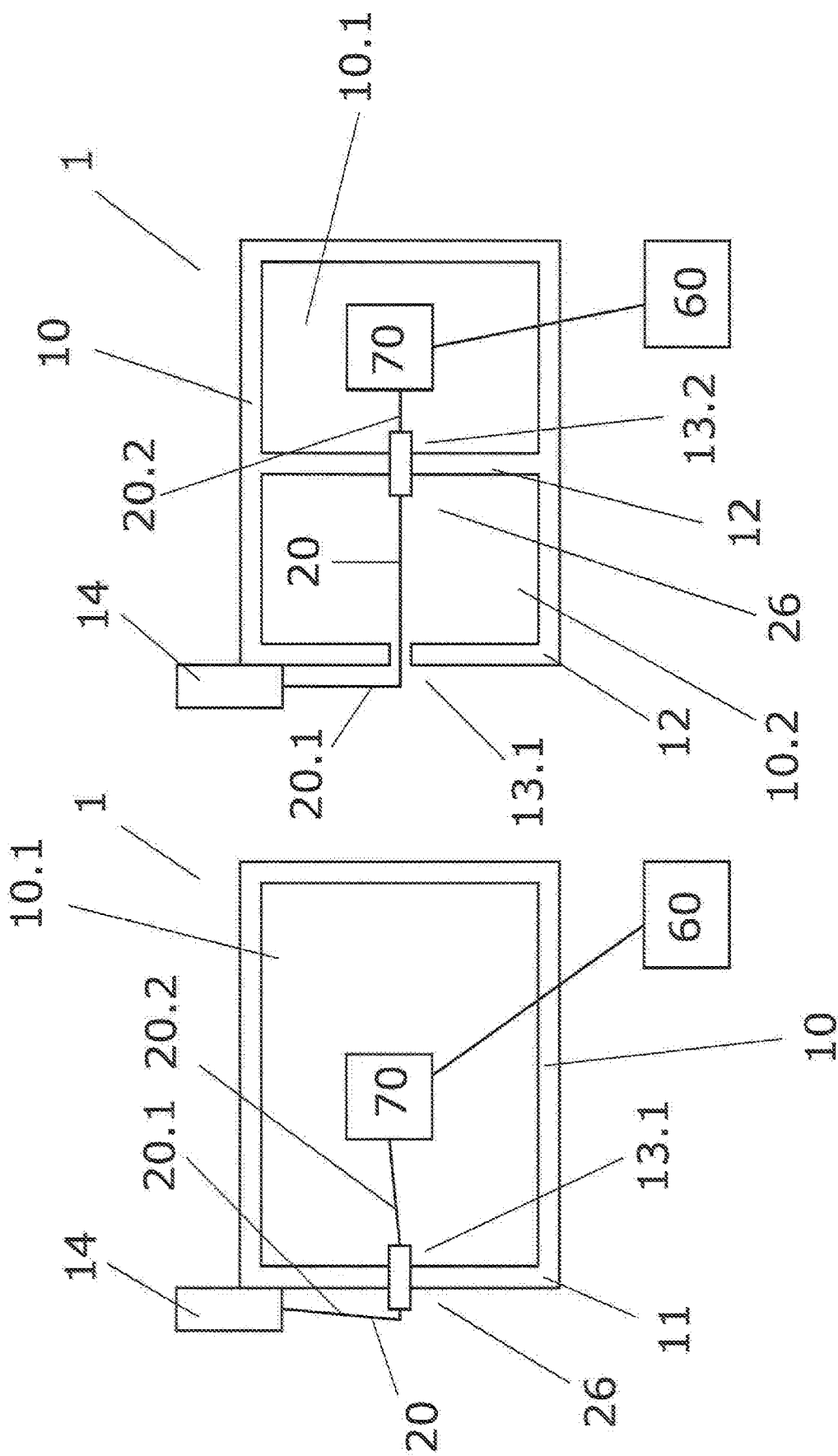
FIGS. 1 *a*), 1 *b*) show schematically, construction of examples of field devices of the present disclosure.

FIG. 1*a*) shows a field device 1 having a housing 10, an electronic operating circuit 70, a measurement electronics 60, a data transmission means 14, a signal line 20 and an isolation device 26. The electronic operating circuit is arranged in a first housing chamber 10.1 of the housing and coupled with the measurement electronics via an electrical connection. Signal line 20 is adapted to connect the data transmission means 14 arranged on an outside of the housing 10 with the electronic operating circuit 70, wherein the signal line extends through a first signal feedthrough 13.1 in a housing wall 11. The isolation device 26 is arranged in the first signal feedthrough 13.1, wherein the illustration is very schematic and enables no conclusions concerning an actual geometric embodiment. A first signal line section 20.1 connects the data transmission means 14 with the isolation device, and a second signal line section 20.2 connects the electronic operating circuit 70 with the isolation device.

The variant of the field device 1 shown in FIG. 1*b*) has an additional, second housing chamber 10.2, wherein the electronic operating circuit 70 is arranged in the first housing chamber. Signal line 20 extends through the second chamber and is, on the one hand, led through a second signal feedthrough 13.2 in an inner wall 12 of the housing 10 to the electronic operating circuit 70 and, on the other hand, through the first signal feedthrough 13.1 to the data transmission means. The isolation device, is, in such case, arranged in the second signal feedthrough; it can, however, also alternatively be arranged in the first signal feedthrough.

The data transmission means is, in such case, preferably operated in a frequency range of at least 0.25 GHz, and especially at least 0.4 GHz, and preferably at least 1 GHz, and at most 10 GHz, and especially at most 8 GHz, and preferably at most 6 GHz.

The electronic operating circuit shown in FIGS. 1*a*) and 1*b*) is adapted to operate the data transmission means and the measurement electronics and to convert a measurement signal produced by the measurement electronics into a measured value.

Figure 2:
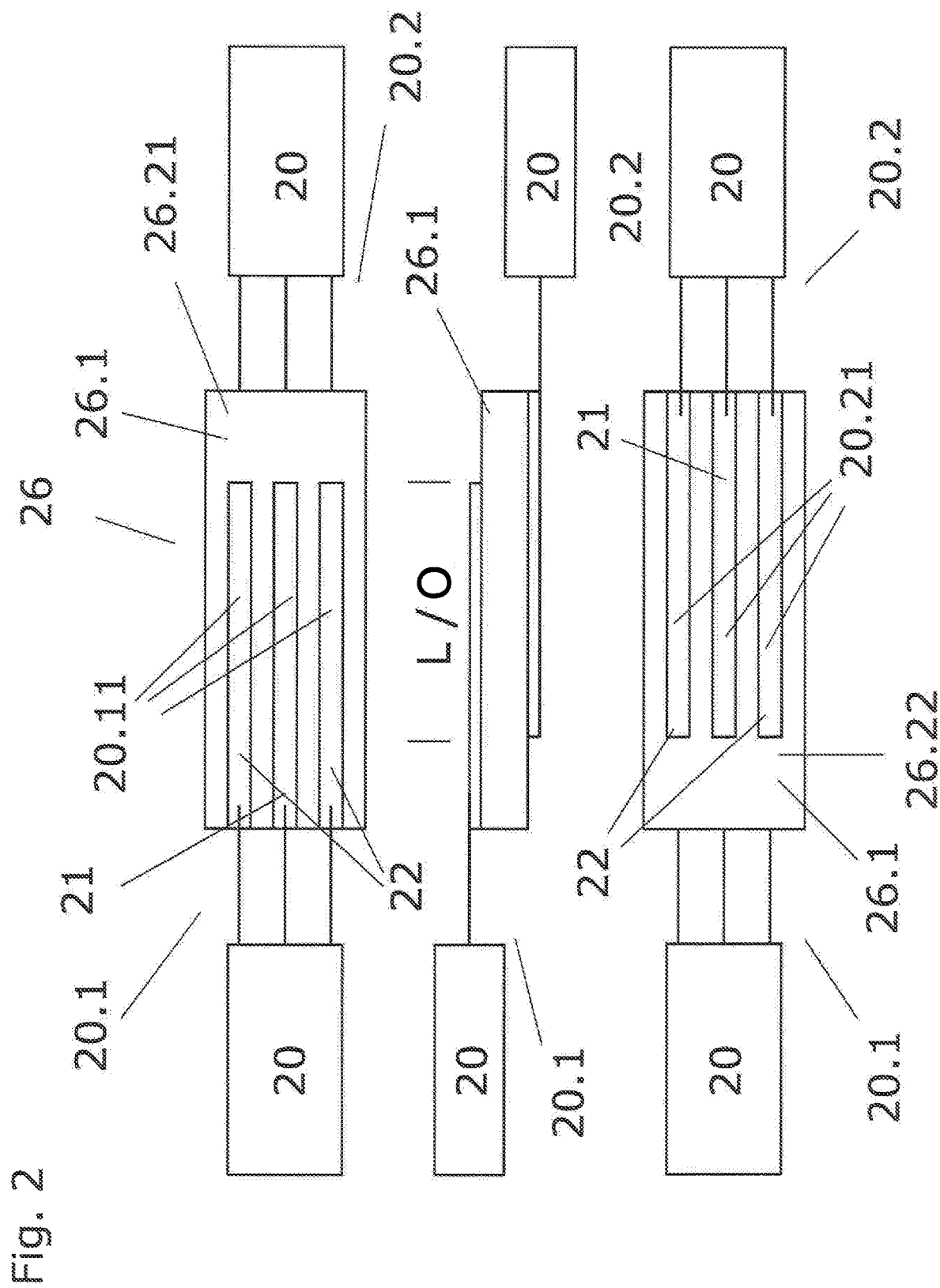
FIG. 2 shows different views of an example of the isolation device of the present disclosure.

FIG. 2 shows a plan view (upper sketch), a side view, as well as a bottom view of the isolation device 26. The isolation device includes an electromagnetically transparent plate 26.1 having a first lateral surface 26.21 and a second lateral surface 26.22, wherein there are arranged on the first lateral surface conductor sections 20.11 the first signal line section 20.1 and on the second lateral surface conductor sections 20.21 the second signal line section 20.2. Signal line 20 is, in such case, preferably a coaxial cable with an inner conductor and an outer conductor, or shielding.

One conductor section of each lateral surface is, in such case, a first conductor 21, which is connected with the signal line 20, for example, with the inner conductor of the coaxial cable. Two conductor sections of each lateral surface are second conductors 22, which are connected with the signal line 20, for example, with the shielding, or outer conductor, of the coaxial cable. The second conductors are arranged on opposite sides of the first conductor.

The length L of the conductors in an overlap region O is, in such case, adapted to the frequency range of the data signal.

Due to opposing directions of the electrical current of the first conductor relative to the electrical current of the at least one second conductor, the electromagnetic fields produced by the conductor superimpose destructively in the far field, this meaning, thus, a radiation of the electromagnetic fields into the far field is made difficult and, thus, data signal attenuation is reduced.

The dimensions of features shown in the drawing are selected for purposes of illustration. Especially, the vertical dimensions of the conductor sections 20.11 and 20.21 are greatly enlarged relative to the electromagnetically transparent plate 26.1.

Alternatively to the variant of the isolation device shown in FIG. 2, the isolation device can also have only one second conductor 22 per lateral surface, wherein the second conductor is arranged alongside the corresponding first conductor 21. Also in this case, a radiation of the electromagnetic fields of the conductors into the far field is effectively made difficult.

Alternatively, a printed circuit board can also be adapted according to the invention for the galvanic isolation of a plurality of signal lines.

FIG. 3 shows, by way of example, concepts for placing the isolation device 26 in a housing wall 11, or inner wall 12. FIG. 3a) shows an isolation device, which is held securely in the housing wall 11, or inner wall 12, by means of a potting material 27. Alternatively, such as shown in FIG. 3b), the isolation device can also be arranged within an enclosure E, which is secured in the housing wall 11, or inner wall 12. The securing of the enclosure can occur, for example, by means of adhesive, welding, pressing in, screwing or soldering.

Alternatively to the two shown examples of embodiments, the isolation device can also be secured in the housing wall 11, or inner wall 12, or the enclosure E without potting material by means of other securement measures 27.

Also in FIGS. 3a) and b), the shown geometric dimensions and arrangements of the features serve only for purposes of illustration. The electrical connections between isolation device 26 and the first signal line section 20.1 as well as the second signal line section 20.2 are shown schematically.

The invention claimed is:

1. A field device of measurement and automation technology, comprising:
   a housing having a housing wall and a first housing chamber, wherein the first housing chamber is bounded at least partially by the housing wall;
   a measurement electronics adapted to produce a measurement signal representing a measured variable;
   a data transmission means;
   an electronic operating circuit, which is arranged in the first housing chamber and is adapted to operate the data transmission means and the measurement electronics as well as to convert the measurement signal into a measured value, wherein the data transmission means is arranged outside of the first housing chamber and is adapted to exchange data with the electronic operating circuit of the field device;
   an electrical signal line connecting the data transmission means and the electronic operating circuit, wherein the electrical signal line includes a plurality of electrical conductors adapted to transfer a data signal between the data transmission means and the electronic operating circuit;
   a first electrical conductor adapted to lead a first electrical current transporting the data signal and a second electrical conductor adapted to lead a second electrical current transporting the data signal, wherein the second electrical current is opposite to the first electrical current; and
   an isolation device adapted to isolate a first, data transmission means side, signal line section galvanically from a second, operating electronics side, signal line section,
   wherein each electrical conductor has a first, data transmission means side, conductor section and a second, galvanically isolated, operating electronics side, conductor section, wherein the conductor sections are arranged on the isolation device,
   wherein the isolation device includes an electromagnetically transparent plate having a first lateral surface and a second lateral surface parallel to the first lateral surface,
   wherein on the isolation device the conductor sections of the first signal line section are arranged on the first lateral surface and wherein the conductor sections of the second signal line section are arranged on the second lateral surface, wherein each first conductor section is opposite the corresponding second conductor section along a lateral surface normal, and
   wherein the plate has at least a minimum thickness or dielectric strength required by a safety standard.

2. The field device as claimed in claim 1,
   wherein the safety standard is a standard from the following list: Product safety standard IEC 60664-1 of the year 2007 or Ex-d standard IEC 60079-1 of the year 2014, or Ex-i standard IEC 60079-11 of the year 2011 or IEC 61010-1 of the year 2010.

3. The field device as claimed in claim 1,
   wherein the housing includes a second housing chamber that is separated from the first housing chamber by an inner wall of the housing, and
   wherein the inner wall has a second signal feedthrough through which the signal line extends.

4. The field device as claimed in claim 3,
   wherein the data transmission means includes an antenna apparatus adapted to receive and/or to transmit high frequency signals,
   wherein the antenna apparatus is arranged on an outside of the housing wall, and
   wherein the signal line extends through a first signal feedthrough in the housing wall.

5. The field device as claimed in claim 4,
   wherein the housing and the first signal feedthrough, and the second signal feedthrough, are embodied pressure-resistantly according to an Ex-d standard, including IEC 60079-1, and
   wherein the isolation device is arranged in the first signal feedthrough or second signal feedthrough and is cast pressure-resistantly by means of a potting material.

6. The field device as claimed in claim 4,
wherein the field device includes an enclosure of the isolation device, in which enclosure the isolation device is arranged,
wherein the enclosure is arranged in the first signal feedthrough, or in the second signal feedthrough,
wherein an outside of the enclosure is connected securely with the first signal feedthrough, or with the second signal feedthrough,
wherein the isolation device is cast pressure-resistantly in the enclosure by means of a potting material.

7. The field device as claimed in claim 1,
wherein each electrical conductor includes a first, data transmission means side, conductor section and a second, galvanically isolated, operating electronics side, conductor section.

8. The field device as claimed in claim 1,
wherein the first electrical conductor and the second electrical conductor extend on the lateral surfaces in parallel with one another, and/or
wherein the conductor sections of the first signal line section on the first lateral surface extend in parallel with the conductor sections of the second signal line section on the second lateral surface.

9. The field device as claimed in claim 1,
wherein two second electrical conductors are associated with the first electrical conductor, and the second electrical conductors are arranged on opposite sides of the first electrical conductor.

10. The field device as claimed in claim 1,
wherein the plate is composed of a dielectric material, wherein the dielectric material comprises at least one material from the following groups of materials: ceramics, plastics, and glass.

11. The field device as claimed in claim 1,
wherein the electrical conductors in the region of the isolation device are prepared by means of a printing or etching method on the lateral surfaces of the plate.

12. The field device as claimed in claim 1,
wherein the electrical conductors on the lateral surfaces are metallic and comprise at least one of the following materials: copper, silver, aluminum, iron, or an alloy containing at least one of these elements.

13. The field device as claimed in claim 1,
wherein a length of the conductor sections in the region of the isolation device in an overlap region is at least 5 mm and at most 150 mm.

14. The field device as claimed in claim 1,
wherein the data signal has a frequency of at least 0.25 GHz and at most 10 GHz.

15. The field device as claimed in claim 14,
wherein a wavelength of the data signal is greater by a factor F than the length of the conductor sections in the region of the galvanic isolation device, wherein F is greater than 1 and less than 5.5.

* * * * *